United States Patent [19]

Gardner et al.

[11] Patent Number: 5,445,975

[45] Date of Patent: Aug. 29, 1995

[54] SEMICONDUCTOR WAFER WITH ENHANCED PRE-PROCESS DENUDATION AND PROCESS-INDUCED GETTERING

[75] Inventors: Mark I. Gardner, Cedar Creek; H. Jim Fulford, Jr.; Derick J. Wristers, both of Austin, all of Tex.

[73] Assignee: Advanced Micro Devices, Inc., Sunnyvale, Calif.

[21] Appl. No.: 206,977

[22] Filed: Mar. 7, 1994

[51] Int. Cl.$^6$ ........................................... H01L 21/324
[52] U.S. Cl. ....................................... 437/10; 437/13; 148/DIG. 60
[58] Field of Search ....................... 437/10, 12, 13, 27, 437/33, 40, 913; 148/DIG. 60

[56] References Cited

U.S. PATENT DOCUMENTS 4,548,654 10/1985 Tobin .................................... 437/12
4,666,532 5/1987 Korb et al. .
5,162,241 11/1992 Mori et al. ............................ 437/12

OTHER PUBLICATIONS

Wolf, "Silicon Processing for the VLSI Era" vol. 2, Process Integration, pp. 314–315, Copyright ©1990 by Lattice Press.
Borland, "Borland's Overview of the Latest in Intrinsic Gettering: Part I", *Semiconductor International*, (Apr. 1989), pp. 144–148.
Borland, "Borland's Overview of the Latest in Intrinsic Gettering: Part II", *Semiconductor International*, (Apr. 1989), pp. 154–157.
Borland, et al. "MeV Implantation Technology: Next-Generation Manufacturing with Current-Generation Equipment", *Solid State Technology*, (Dec. 1993), pp. 1–8.
Borland, et al., "Advanced CMOS Epitaxial Processing for Latch-Up Hardening and Improved Epilayer Quality", *Solid State Technology*, (Aug. 1984), pp. 123–131.

*Primary Examiner*—Olik Chaudhuri
*Assistant Examiner*—S. Mulpuri
*Attorney, Agent, or Firm*—Conley, Rose & Tayon

[57] ABSTRACT

A method is provided for pre-process denudation and process-induced gettering of a CZ silicon wafer having one or more monolithic devices embodied therein. Pre-process denudation is performed in a hydrogen ambient to out-diffuse oxygen as well as to maintain interstitial silicon flux away from the substrate surface. Process-induced gettering is performed at a low temperature to ensure stacking faults and surface irregularities do not arise from interstitial silicon bonding at the surface prior to gate oxidation. The third step of the denudation/gettering cycle involving precipitate growth is thereby delayed or forestalled until the field oxide is grown. Any changes or movement in oxygen and/or interstitial silicon within or near the substrate surface occurring after polysilicon deposition will have minimal effect upon the established gate oxide. Accordingly, gate oxide integrity (e.g., breakdown voltage and uniformity) are enhanced by the present process.

1 Claim, 4 Drawing Sheets

SEMICONDUCTOR WAFER WITH ENHANCED PRE-PROCESS DENUDATION AND PROCESS-INDUCED GETTERING

BACKGROUND OF THE INVENTION

1. Field of the Invention

This invention relates to integrated circuit manufacture and more particularly to intrinsic gettering of a silicon substrate and processing steps used to maintain a denuded area and gate oxide quality upon the denuded area.

2. Background of the Relevant Art

It is well known that steps can be taken to remove lifetime reducing dopants (usually some of the heavy metals) from regions of the circuit where their presence would degrade performance. Not only does their presence reduce the minority carrier lifetime, but the dopants can also lessen mobility in MOS structures and increase the resistivity for both n- and p-type material. High minority carrier lifetime is desirable for many reasons, including minimizing reverse junction leakage, improving bipolar transistor gain, and increasing refresh time in dynamic MOS memories. In order to remove the lifetime reducing dopants from active regions of the circuit, techniques such as "gettering" and "denudation" are generally employed prior to or during semiconductor processing.

As defined herein, "semiconductor processing" or processing of the silicon substrate generally refers to the steps necessary to pattern, grow, implant and deposit various materials and ions upon and into the substrate to form a plurality of monolithic devices. Prior to processing of the silicon substrate, many manufacturers incorporate pre-process denuding and gettering steps. Pre-process denuding and gettering generally involves conditioning the unprocessed silicon wafer as it arrives from the vendor. Instead of pre-process denuding and gettering, other manufacturers may perform denuding and gettering (i.e., process-induced denuding and gettering) during the circuit processing steps.

As set forth in U.S. Pat. Nos. 4,666,532 and 4,548,654 (incorporated herein by reference), the term gettering generally refers to the precipitation of oxygen in substrate materials and the production of lattice strain, dislocation loops and stacking faults within the substrate bulk. The strain, loops and faults are often the result of $SiO_x$ precipitation growth. Precipitation growth causes lattice disorders and dislocations which act as gettering sites (traps) for unwanted, lifetime reducing dopants. Gettering can often be performed in inactive sites distant from the surface region of the silicon substrate and therefore is often referred to as intrinsic gettering. Intrinsic gettering not only produces the gettering sites resulting from precipitation, but also produces certain intrinsic material properties of Czochralski (CZ) grown silicon wafers (e.g., interstitial oxygen, substitutional carbon, silicon-vacancies and interstitial silicon).

The concept of producing gettering sites within the bulk silicon away from the active region is recognized in the art as providing substantial improvements in semiconductor wafer yield. However, the industry also recognizes the importance of depleting oxygen in the silicon substrate in the active regions near the substrate surface where devices are formed. Oxygen depletion in this region is generally referred to as denuding, and involves the out-diffusion of interstitial oxygen atoms from a wafer surface area (denuded area).

To improve device performance, both gettering and denudation steps are necessary. Conventional intrinsic gettering and denuding are generally performed as either a pre-process, three-step cycle or are incorporated (i.e., process-induced) within the processing steps of semiconductor fabrication. See, e.g., Borland, "Borland's Overview of the Latest in Intrinsic Gettering: Part I and Part II", *Semiconductor International* (April, 1989 and May, 1989) (incorporated herein by reference). The three-step intrinsic gettering, pre-process cycle generally involves subjecting the wafer as it arrives from the vendor to a high temperature ambient (usually greater than 1100° C.) to out-diffuse the interstitial oxygen and form the denuded area directly below the substrate surface. Next, the wafer is cooled to a lower temperature (oftentimes less than 850° C.) in order to allow nuclei of $SiO_x$ to form. The three-step process is completed by thereafter subjecting the wafer to a higher temperature in the range of approximately 900° C. to 1000° C. to form large precipitates from the $SiO_x$ nuclei. $SiO_x$ precipitation growth exceeding a critical size will form intrinsic lattice defects and thereby produce gettered areas. It is primarily the second and third steps of the three-step process which is responsible for intrinsic gettering, while the first step is used for denuding.

As taught in U.S. Pat. No. 4,548,654, use of a reducing ambient, such as hydrogen, during the denuding step results in acceleration of the out-diffusion of oxygen by avoiding formation of a barrier film at the substrate surface. Hydrogen combines with the out-diffused oxygen to form water which is carried from the wafer surface. While hydrogen appears to provide acceleration of the denuding process, conventional knowledge appears limited as to other advantages hydrogen may provide at the denuding step.

Maintaining hydrogen ambient for subsequent pre-processing steps, mainly gettering steps, can be expensive and time consuming. Moreover, after oxygen is out-diffused, hydrogen is generally not necessary to perform gettering. Thus, it would be advantageous to eliminate pre-process gettering and incorporate the gettering steps into the normal process flow of device fabrication. However, conventional processing steps are not easily adapted for incorporating the second and third (low temperature and subsequent high temperature) gettering steps. Generally speaking, if a wafer is pre-process denuded, then well regions which are thereafter formed require a high temperature drive-in step. The high temperature drive-in may not allow sufficient formation of $SiO_x$ nucleation required by the second step prior to the higher temperature third step. Thus, many manufacturers provide all three steps of denudation and gettering prior to semiconductor processing. Alternatively, manufacturers might incorporate all three steps into the semiconductor process flow. In the former, pre-process gettering adds to the steps and costs necessary to produce an integrated circuit. In the latter, process-induced denudation and gettering cannot achieve the advantages of hydrogen denudation unless the process flow is retrofitted with a hydrogen chamber.

The denuding step is performed at higher temperatures necessary to move oxygen along interstitial sites away from the silicon substrate surface. After the denuded area is formed, any future high temperature cycles may cause migration of oxygen and/or interstitial silicon atoms into the denuded area and near the substrate surface. If the denuded area receives substantial amounts of oxygen or interstitial silicon, the denuding area will be compromised and may provide gettering of heavy metal atoms at what was previously a denuded area. The dislocations caused by ingress of oxygen and interstitial silicon not only affects electrical characteristics in the active or channel regions due to the presence of metal atoms, but can also adversely affect structures grown upon the denuded area. Accordingly, it is important to maintain the quality of the denuded area during subsequent processing steps which undergo thermal cycling. It is certainly important to maintain denude quality prior to and during specific critical steps in the process flow.

It would be advantageous to provide a process flow in which denudation occurs as a pre-process step and that gettering occur during process. It would be further advantageous that hydrogen be used not only to accelerate out-gassing of oxygen, but also to provide enhanced silicon surface properties. It would be still further advantageous that the silicon surface properties be maintained during the initial stages of device processing, up to and including the formation of the gate oxide and the polysilicon layer over the gate oxide. The advantages of this methodology is to maintain the quality of the denuded area at least until after certain critical processing steps so that structures formed on the denuded silicon surface will have enhanced characteristics.

SUMMARY OF THE INVENTION

The problems outlined above are in large part solved by the pre-process denudation and process-induced gettering methodology Of the present invention. That is, by performing denudation as a pre-process step, denudation can be performed in a hydrogen ambient to not only enhance out-diffusion of oxygen, but more importantly to control excess flux of interstitial silicon atoms away from the substrate surface. Flux away from the substrate surface is maintained during the early stages of device fabrication up to and including polysilicon deposition. It is not until field oxide formation that the final gettering step is performed. The final gettering step occurs at a temperature range between 900° C. and 1000° C. The gettering step is sufficient to allow precipitate growth but does not allow oxygen out-diffusion. Oxygen out-diffusion occurs at a temperature range exceeding approximately 1100° C. By performing gettering at field oxide and at temperatures less than oxygen out-diffuse temperature, the denuding zone previously formed at the pre-process step is not compromised with added oxygen. Thus, the denuded surface will not contain gettering sites for trapping impurities such as heavy metal atoms, nor will it produce substantial dislocations which could deleteriously effect gate oxides grown thereon. As a result of this process, substantial improvements in the quality of the gate oxide, including enhancement of gate oxide breakdown, is achieved.

Importantly, the present process flow utilizes high energy (MeV) well implants and, by the nature of MeV implant, lower temperature processing steps can be maintained prior to gate oxide formation. Thus, higher temperatures necessary to cause substantial oxygen out-diffusion and/or interstitial silicon movement into the denuded area are not present during well formation prior to gate oxide formation. By using MeV implant techniques in conjunction with pre-process hydrogen denudation and process-induced gettering (at field oxide formation), the present invention achieves, among others, the advantages of hydrogen denudation coupled with lower cost process-induced gettering steps.

Broadly speaking, the present invention contemplates a method for maintaining a denuded area and a substantially planar denuded area topography. The method comprises the steps of providing a silicon substrate having oxygen atoms and interstitial silicon atoms incorporated therein. The silicon substrate is then heated in a hydrogen ambient to a temperature exceeding 1100° C. to out-diffuse the oxygen atoms and form a denuded area substantially void of the oxygen atoms and interstitial silicon atoms within the surface of the substrate. Prior to polysilicon deposition, the substrate is then processed at temperatures less than 1000° C. to minimize movement of the oxygen atoms into and from the denuded area, and also to minimize formation of and movement of interstitial silicon atoms from the denuded area to the surface of the substrate. Thereafter, polysilicon is deposited upon a gate oxide formed on the surface of the substrate. If the gate oxide is approximately 180 Å and the gate oxide is formed on a 2 mm² area, then the breakdown voltage achieved by that gate oxide is greater than 20 volts. Moreover, the exemplary formed gate oxide can have a thickness variability (at the atomic level) less than approximately 10 percent.

The present invention still further contemplates a method for preparing high quality gate oxide upon a denuded area by forestalling final gettering temperatures until after field oxide is grown. The method comprises forestalling high temperatures (greater than 1000° C.) until after gate oxide is formed and polysilicon is deposited. The method comprises the steps of providing a silicon substrate having oxygen atoms and silicon atoms incorporated therein. A denuded area is then formed near the surface of the substrate which is substantially void of oxygen atoms and interstitial silicon atoms. A field oxide can then be grown upon select regions of the substrate. The field oxide is grown in a temperature ambient less than 1000° C. to minimize movement of the oxygen atoms into and from the denuded area and also to minimize formation of and movement of interstitial silicon atoms to the surface of the substrate. Thereafter, at least one well impurity type is implanted through the field oxide at an energy greater than 1 MeV. The well impurity type is heated to a temperature less than 1000° C., and usually less than 900° C., for annealing the impurity type within the denuded area while substantially maintaining the position of the oxygen atoms and silicon atoms in the substrate. A gate oxide is then grown upon the denuded area in a temperature less than 1000° C. The surface of the substrate and denuded area (prior to oxide formation) is substantially uniform as a result of the absence of oxygen atoms and interstitial silicon atoms formed thereon and also as a result of minimal lattice dislocations and stacking faults caused by the migration of interstitial silicon atoms.

The present invention still further contemplates a method for minimizing flux of oxygen atoms and interstitial silicon atoms toward the surface of the silicon substrate after initial pre-process denudation and during process-induced gettering. The method comprises the steps of denuding in the presence of hydrogen ambient a plurality of oxygen atoms from a surface area within the silicon substrate. The denuding step is performed prior to processing of the silicon substrate and formation of active devices within the substrate. Once processing begins and prior to placing polysilicon upon the silicon substrate, the substrate is processed at a temperature less than 1000° C. to minimize formation of and movement of interstitial silicon atoms from the silicon substrate to the surface of the substrate. A patterned field oxide is formed upon the substrate, and MeV-implanted well regions are placed through windows between the patterned field oxide. Next, a gate oxide is grown upon the well region and polysilicon is deposited upon the gate oxide. Thereafter processing is continued upon the silicon substrate at temperatures above 1000° C. to provide gettering sites within the substrate.

BRIEF DESCRIPTION OF THE DRAWINGS

Other objects and advantageous of the invention will become apparent upon reading the followed detailed description and upon reference to accompanying drawings in which.

Figure 1:
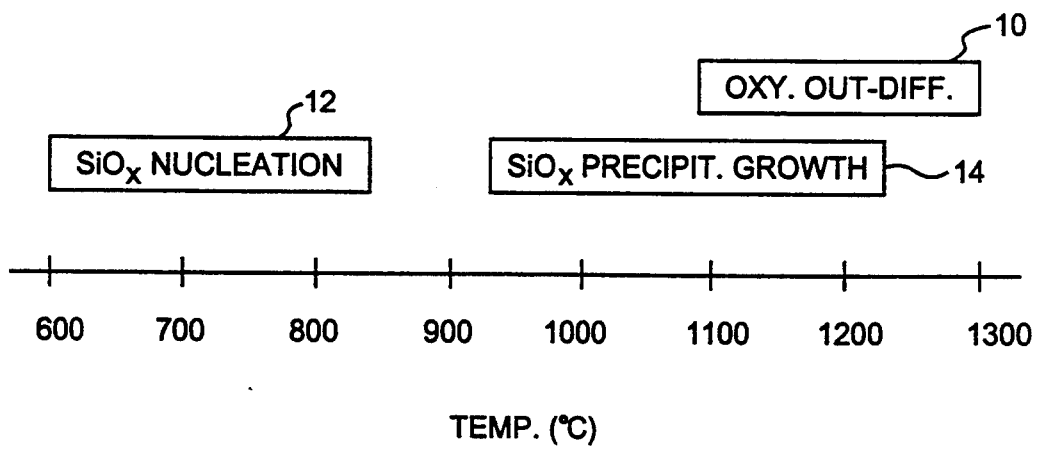
FIG. 1 is a graph of temperature requirements for denuding and gettering of a silicon substrate according to the present invention.

While the invention is susceptible to various modifications and alternative forms, specific embodiments thereof are shown by way of example in the drawings and will herein be described in detail. It should be understood, however, that the drawings and description thereto are not intended to limit the invention to the particular forms disclosed, but on the contrary, the intention is to cover all modifications, equivalents, and alternatives falling within the spirit and scope of the present invention as defined by the appended claims.

DETAILED DESCRIPTION OF THE INVENTION

Turning now to FIG. 1, temperature requirements are shown for effectuating the three-step thermal cycle necessary for denuding and intrinsic gettering of a CZ silicon substrate. The three-step process must be followed in specific order beginning with the denudation step 10 occurring at relatively high temperatures between approximately 1100° C. and 1300° C. Denudation is necessary to allow oxygen near the surface of the substrate to out-diffuse and also to dissolve any oxygen aggregates that may be in the wafer bulk. As described below, denudation 10 occurs as a pre-process step and before any activity such as thin-film deposition or implantation occurs upon an within, respectively, the substrate. After denudation, the substrate is subjected to a relatively low temperature thermal cycle 12 in order to allow non-stoichiometric silicon dioxide ($SiO_x$) nucleation. The lower temperature allows silicon and oxygen atoms at or near the intrinsic regions within the substrate bulk to form nuclei of $SiO_x$ complexes. Induced nuclei formation deep within the substrate bulk is necessary to target ares in which future gettering sites (traps) will be formed. The gettering sites, however, are not formed until the $SiO_x$ nuclei precipitate beyond a critical amount. Precipitation growth 14 generally occurs in a temperature range between 950° C. and slightly above 1200° C.

Nucleation 12 followed by precipitate growth 14 are generally described as the latter two steps of the three-step process and generally make-up what is often referred to as the intrinsic gettering steps. It is not until after the nuclei grow to a critical level 14 will the gettering process be achieved. The lower temperature nucleation step 12 is necessary to define where the eventual gettering sites will be formed. All three steps of oxygen out-diffusion 10, followed by nucleation 12 and precipitate growth 14 are necessary to form the denuded area near the substrate surface and the gettering sites within bulk. The gettering sites attract and trap minority carrier lifetime reducing dopants deep within the substrate bulk and away from the active areas near the surface of the substrate (i.e., away from the denuded area).

Figure 2:
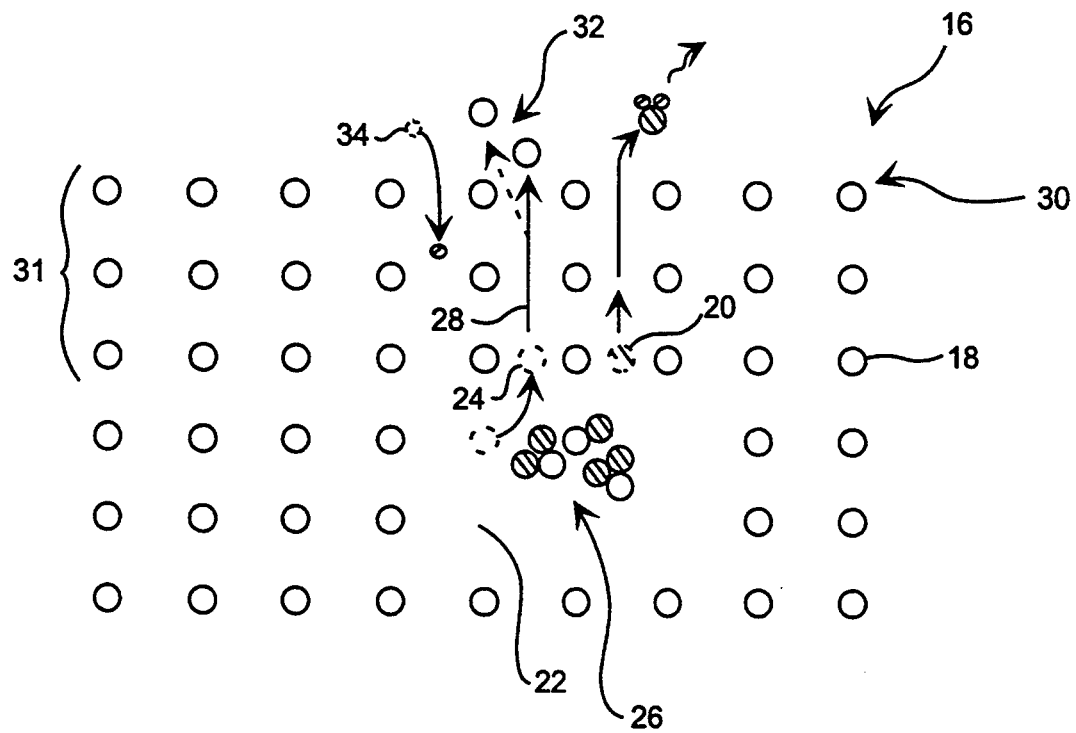
FIG. 2 is an atomic view of a portion of a silicon substrate with impurity out-diffusion and non-stoichiometric silicon dioxide ($SiO_x$) formation according to the present invention.

Turning now to FIG. 2, an atomic view of a portion of a silicon substrate 16 is shown. Substrate 16 is grown by the Czochralski (CZ) process to define a single crystal lattice structure of silicon atoms 18. Arranged within the lattice are various intrinsic material properties of CZ grown silicon wafers such as interstitial oxygen atoms 20, silicon vacancies 22, interstitial silicon atoms 24, grown precipitates 26, etc. Critically sized precipitates 26 generate disorders and dislocations within the lattice structure which act as gettering sites for the unwanted impurities. Also associated with precipitates 26 growth is the formation and/or ejection of silicon interstitials 24. It is postulated that silicon interstitials 24 are generated and ejected due to the volumetric expansion of the silicon lattice as the $SiO_x$ complex forms. Ejected interstitial silicon 24 generally migrate away from the precipitate along the direction of arrows 28 and towards the surface 30 of silicon substrate 16. Thus, growth of precipitates 26 forms an excess flux of interstitial silicon away from the bulk of the wafer and toward surface 30, wherein the interstitial silicon can form surface termination bonds 32 as extensions of the lattice structure or at interstitial locations at the lattice surface.

It is postulated that denudation can force an excess flux of interstitial silicon atoms away from surface 30 and into the bulk of the wafer provided, however, the denuding ambient is an inert species such as hydrogen. It appears that hydrogen ambient not only accelerates the denudation process, but also prevents substantial film formation at surface 30, such as would be the case if an oxygen ambient were used and an oxide film were formed. Hydrogen atoms 34 are taken from the ambient and, as a result of their high diffusivity, migrate preferably along interstitial sites forcing any interstitial atoms such as interstitial oxygen out of and interstitial silicon deeper into the bulk region. It is postulated that hydrogen migration counteracts or lessens surface migration of interstitial silicon. Thus, it appears that hydrogen atoms 34 take an active role in assuring that, at the denuding step only, interstitial silicon atoms do not form and migrate in substantial amounts to the surface region 30. Interstitial oxygen 20, however, readily migrates to the surface where it actively bonds with the hydrogen and is removed as water.

It is important when growing a high quality gate oxide, and especially gate oxides having a thickness less than 100 Å (i.e., tunnel oxides in EEPROMs), surface 30 must be maintained substantially planar and interstitial silicon be prevented from migrating to and bonding at sites 32. Such bonding can result in what is often referred to as oxidation induced surface stacking faults (OISF). OISFs are more serious than micro-defects (pits) upon surface 30. OISFs cause lattice disruption at the surface and irregular oxide formation. It is postulated that severe disruption may lead to gate oxides having drastically non-uniform thicknesses and, as a result, exhibit lower gate oxide breakdown voltages in the thinner areas. Accordingly, it is important to minimize OISFs by controlling the surface migration of interstitial silicon atoms 24. While denudation in a hydrogen ambient appears to lessen surface migration, precipitate growth at temperatures exceeding 1000° C. can enhance such surface migration. As will be discussed below, a process step is used to perform low temperature precipitate growth during the initial stages of device fabrication. Namely, it is necessary to control surface migration of oxygen atoms and interstitial silicon during process steps which occur prior to gate oxide formation and polysilicon deposition. After the gate oxide is formed and is sufficiently capped with a polysilicon layer, subsequent influences upon the previously grown and capped gate oxide are minimal or non-existent. Thus, precipitate growth and gettering is performed at lower temperatures until after the oxide is established and protected with the polysilicon capping layer.

Denuded area 31, formed as a pre-process step in a hydrogen ambient, is initially fixed having a significant absence of interstitial oxygen and silicon atoms. It is important to maintain the integrity of denuded area 31 by minimizing higher temperature thermal cycles (i.e., thermal cycles which extend into the denuding temperature range) for process steps which occur prior to polysilicon deposition. Accordingly, gettering, which occurs at field oxide, must be performed at lower temperatures of less than 1000° C. to prevent interstitial oxygen atoms 20 from entering denuded area 31 and remaining in that area. The presence of oxygen or interstitial silicon atoms within denuded area 31 allow the formation of metal atom gettering traps and the deleterious effects thereof. Not only do metal atoms adversely affect electrical operation in the active channel regions, but also cause localized thinning of any gate oxide formed at the surface 30 of denuded area 31. The heavy metals can certainly affect tunneling characteristics in EEPROMs devices. If significant amounts of metal atoms are present, the semiconductor regions can become conductive. By closely monitoring and maintaining gettering temperatures prior to polysilicon deposition, the denuded area 31 does not significantly collapse by ingress of unwanted oxygen and interstitial silicon atoms.

Figure 3:
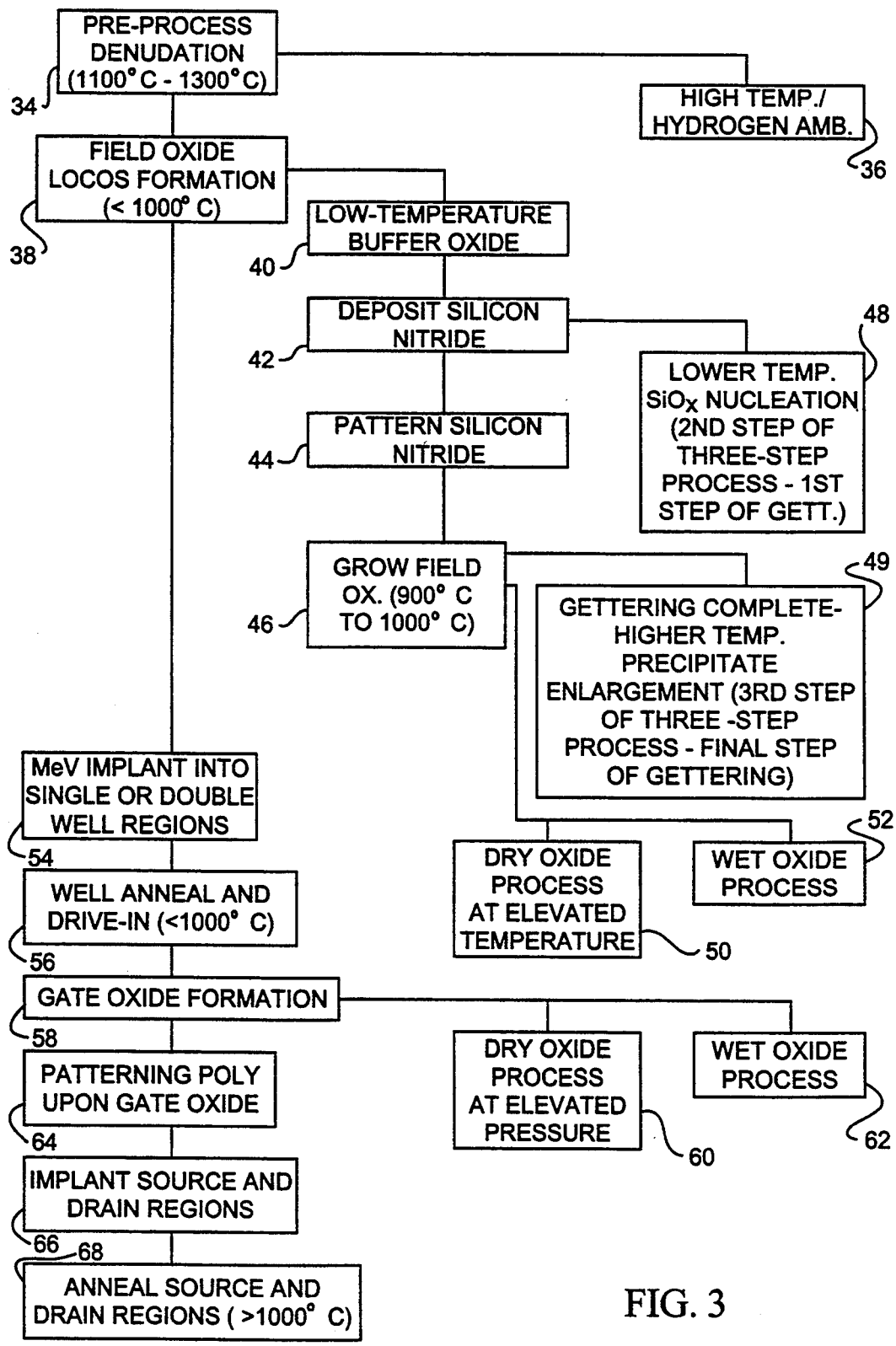
FIG. 3 is a flow diagram of pre-process denudation and post polysilicon deposition gettering methodology according to the present invention.

Turning now to FIG. 3, a flow diagram of pre-process denudation and post polysilicon deposition gettering is shown. The flow diagram illustrates exemplary steps necessary to pre-process denude and process-induce getter sites within a bulk CZ wafer. Importantly, denudation is achieved using hydrogen ambient and process-induced gettering is achieved using MeV well implant techniques. Still further, the denuded and gettered substrate achieves the advantages of an epitaxial (EPI) layer without having to form an EPI layer and incur the costs associated therewith. The denuded region and gettering sites below the denuded region provide high quality gate oxides, and can achieve low junction leakage without having to form an EPI layer or buy wafers having a pre-formed EPI layer. In situations where a monolithic device is cost competitive, it is crucial that the substrate be prepared without having to incur added steps associated with formation of an EPI layer by the manufacturer or vendor.

Processing of high quality gate oxide using pre-process denudation and process-induced gettering begins by the pre-process denudation step 34. Denudation is performed in a hydrogen ambient and at a high temperature in the range of 1100° C. to 1300° C. as shown by reference numeral 36. After the surface region is denuded, the wafer is sent through it normal process flow to form numerous monolithic devices upon the substrate. The process generally begins by forming field oxide at select regions across the wafer surface 38. Field oxide is locally oxidized according to the LOCOS process by initially growing a buffer oxide 40 followed by silicon nitride 42 placed over the buffer oxide. Silicon nitride can then be patterned 44 with photoresist. The patterned nitride allows select growth of field oxide 46 in areas void of silicon nitride. The buffer oxide helps reduce the stress at the nitride-silicon interface and thereby minimizes dislocations generated in the silicon at the corners of non-nitride windows during subsequent oxidation. The buffer oxide is usually quite thin, and in most instances is less than 400 Å. A thin buffer oxide helps lessen "birdbeak" structures at the window interface.

Formation of select regions of field oxide, including the underlying buffer oxide, are grown in an ambient temperature less than 1000° C. The silicon nitride is deposited at an even lower temperature of, for example, less than 850° C. Since the silicon nitride is usually quite thin, lower temperature deposition techniques can be used, and associated lower deposition rates tolerated, since even at the lower rates, silicon nitride can be formed in a relatively short period of time. The field oxide, however, is grown at a higher temperature but, the temperature ambient must be maintained less than 1000° C. so as to prevent the collapse of the denuded area. Yet, the temperature ambient must be high enough to cause the third step of the three-step process to occur. Silicon nitride deposition at less than 850° C. can suffice as the second step of the three-step process, and can therefore allow $SiO_x$ nucleation as shown by reference numeral 48. In order to elevate the growth rate of field oxide, either a dry oxide process at elevated temperatures 50 or a wet oxide process 52 can be used. Growth rate details and oxidation time for wet and dry oxide processes is described below in reference to FIG. 4. If target thickness of the field oxide is 4000 Å or, in some cases, 7000 to 8000 Å, then high growth rate is critical to achieving wafer throughput.

An important advantage of the process flow shown in FIG. 3 is the use of MeV implant of well regions through the field oxide and into the silicon substrate. MeV implant not only decreases the number of processing steps but, more importantly, reduces well drive-in temperatures at the anneal stage 56. Well anneal temperatures can be reduced below 1000° C. to approximately 900° C. and, therefore, below denudation temperature of 1100° C. The temperature reduction is significant; conventional CMOS device processing for the same well drive-in step might require temperatures of 1150° C. to 1200° C. for three to as long as twenty-one hours. See, e.g., Borland, et al., "MeV Implantation Technology: Next-Generation Manufacturing with Current-Generation Equipment" Solid State Technology, (December, 1993). Incorporating the gettering steps into the process flow achieves time-savings and cost reduction. Moreover, low temperature MeV processing forestalls diffusion or migration of oxygen and interstitial silicon atoms into and within the denuded area until after gate oxide formation.

The final step (third step of the three-step process) of gettering is completed at the time in which the field oxide is grown, as shown by step 49. The final step of $SiO_x$ precipitation growth is performed in a temperature range less than 1000° C. at the time in which the field oxide is grown within a range of 900° C. to 1000° C. Completion of gettering is necessary to fix the gettering sites within the substrate bulk away from the denuded area. Precipitation occurs at a sufficiently low temperature to prevent oxygen and interstitial silicon atoms from moving into the denuded area previously formed at step 34.

After the well regions are high energy implanted (at an energy greater than 1 MeV) through and between the patterned field oxide, then gate oxide is formed over the denuded area in windows between field oxide, as shown in step 58. Similar to field oxide, gate oxide can be grown by either a dry oxide or wet oxide process. If a dry oxide process 60 is chosen, then growth rates can be enhanced by using an elevated pressure in the growth chamber. A wet oxide process 62 can be performed at pressures at or near atmospheric pressure (760 Torr). It is important to note that "gate oxide" refers to the oxide region formed between the substrate and overlying polysilicon. In an EEPROM process, a tunnel oxide is formed as part of the gate oxide. The tunnel oxide is formed by etching away a portion of a gate oxide region and then growing a non-tunnel area and a tunnel area. In many applications, the tunnel area (oxide) is approximately 85 Angstroms, and the adjacent non-tunnel oxide is approximately 180 Angstroms. If the gate oxide does not include a tunnel oxide, then it is usually quite thin and usually less than several hundred Angstroms. When the gate oxide includes a thin tunnel oxide region, the gate oxide can be formed quickly at relatively low temperatures similar to the formation of buffer oxide at step 40. Thus, tunnel oxide formation necessary in EEPROM fabrication is well suited for the current process.

After the gate oxide is formed, polysilicon is deposited and patterned upon the gate oxide as shown in step 64. In accordance with the self-aligned process, source and drain regions are then implanted in the active areas. The source and drains are implanted into the substrate on opposite sides of the polysilicon gate and in the windows between the field oxide, as shown in step 66. The next thermal cycle generally involves an anneal step subsequent to the source and drain implants. The source and drain anneal which activates the impurity dopants can be performed at any temperature and, is preferably performed at a temperature exceeding 1000° C., as shown in step 68. High temperatures at anneal step 68 are such that oxygen and interstitial silicon atoms may enter the denuded area and possibly migrate towards the substrate surface. Ingress of impurities such as interstitial oxygen and interstitial silicon will not affect the already-formed gate oxide and the properties of the surface on which the gate oxide is grown. Thus, any collapse of the denuded zone and formation of gettering sites near the surface of the denuded zone are not of major significance provided they occur after the gate oxide is grown and capped with a polysilicon conductor, as shown in steps 58 and 64, respectively. Accordingly, the deleterious effects of interstitial silicon and oxygen movement to the substrate surface and OISFs are substantially minimized, eliminated, or rendered moot.

Figure 4:
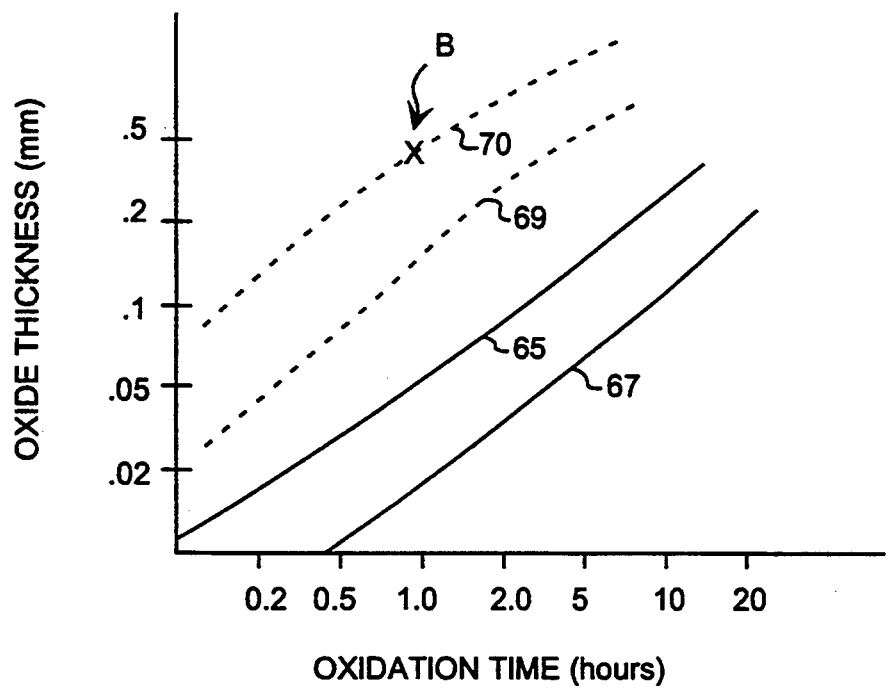
FIG. 4 is a graph of wet and dry thermal oxidation as a function of time for field and gate oxides formed according to a process step of FIG. 3.

Turning now to FIG. 4, a graph of wet and dry thermal oxidation as a function of time is provided for field and gate oxides formed according to the process steps of FIG. 3. Specifically, dry oxide can be grown at 1000° C. as shown by curve 65, or at 900° C. as shown by curve 67. Additionally, wet oxide can be formed in a steam ambient at 900° C. or 1000° C. as shown by curves 69 and 70, respectively. As shown in FIG. 4, increase in temperature ambient or by adding moisture to the ambient will increase oxidation rate. At oxidation temperatures of 1000° C., wet oxide can form to a thickness of 4000 Å at an oxidation time of approximately 1 hour, as shown by point B on curve 70. Wet oxidation is therefore a preferred method to form field oxide exceeding 4000 Å. If dry oxidation is used, then pressurized ambient is necessary to increase the oxidation rate. For gate oxide thicknesses less than 200 Å, dry oxidation produces a suitable result in a relatively short period of time.

Figure 5:
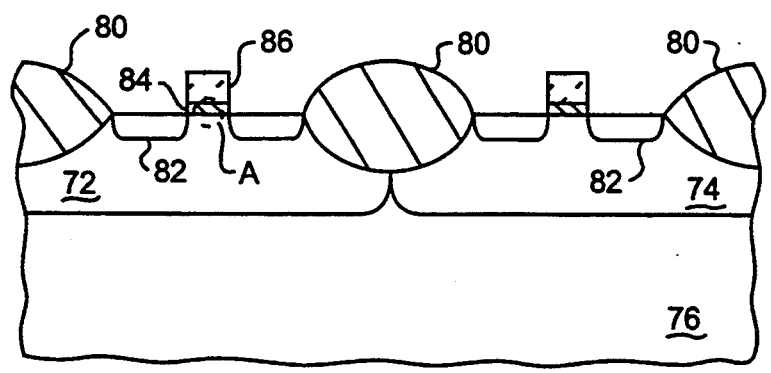
FIG. 5 is a cross-sectional view of a dual-well device formed upon and within a silicon substrate according to the process steps of FIG. 3.

Referring now to FIG. 5, a cross-sectional view of dual-well device (CMOS) formed upon a silicon substrate is shown according to the process steps of FIG. 3. In particular FIG. 5 illustrates opposite impurity-type well regions 72 and 74 placed within a substrate starting material 76. Well regions 72 and 74 are implanted using high energy implant techniques, often referred to as MeV implantation. Well regions 72 and 74 can be implanted to depths of several microns into the substrate and through field oxides 80. Implanted at a shallower depth in the well regions and between field oxides 80, according to the self-aligned process, are source and drain regions 82. Prior to source/drain implantation and after well implant and anneal is the process of growing gate oxide 84. Gate oxide 84 is capped with a polysilicon gate conductor 86.

Figure 6:
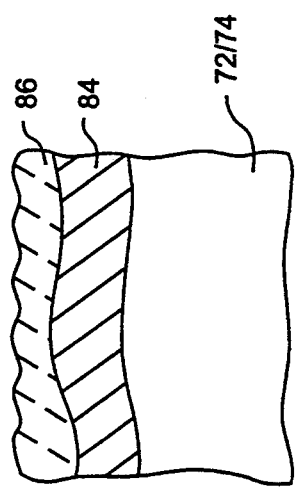
FIG. 6 is detailed view along plane A of FIG. 5.

FIG. 6 illustrates a detailed view along plane A of FIG. 5, and shows the geometric configuration of gate oxide 84 formed according to the present process steps. Gate oxide 84 can be relatively thin and may have certain areas (micro-structure areas) which are thinner than others. However, by minimizing precipitate growth and surface migration of oxygen atoms and interstitial silicon atoms, gate oxide 84 can be formed at a relatively even thickness. Gate oxide 84 formed according to the process of FIG. 3 generally comprises a thickness defined within a select gate area (e.g., less than 3 microns$^2$) as having a variability less than 10 percent. Minimal OISFs occur at the surface of substrate 72/74, thereby allowing good integrity of oxide 84. Moreover, by delaying or forestalling precipitation growth, stacking faults within the substrate bulk are also minimized. By minimizing internal and surface stacking faults, dislocations and lattice slippage caused by precipitate growth, gate oxide 84 can be grown from a fairly uniform and planar upper surface of substrate 72/74. Accordingly, gate oxide 84 is grown from a good seed starting surface and thereby achieves even configuration and thickness across the gate region.

Figure 7:
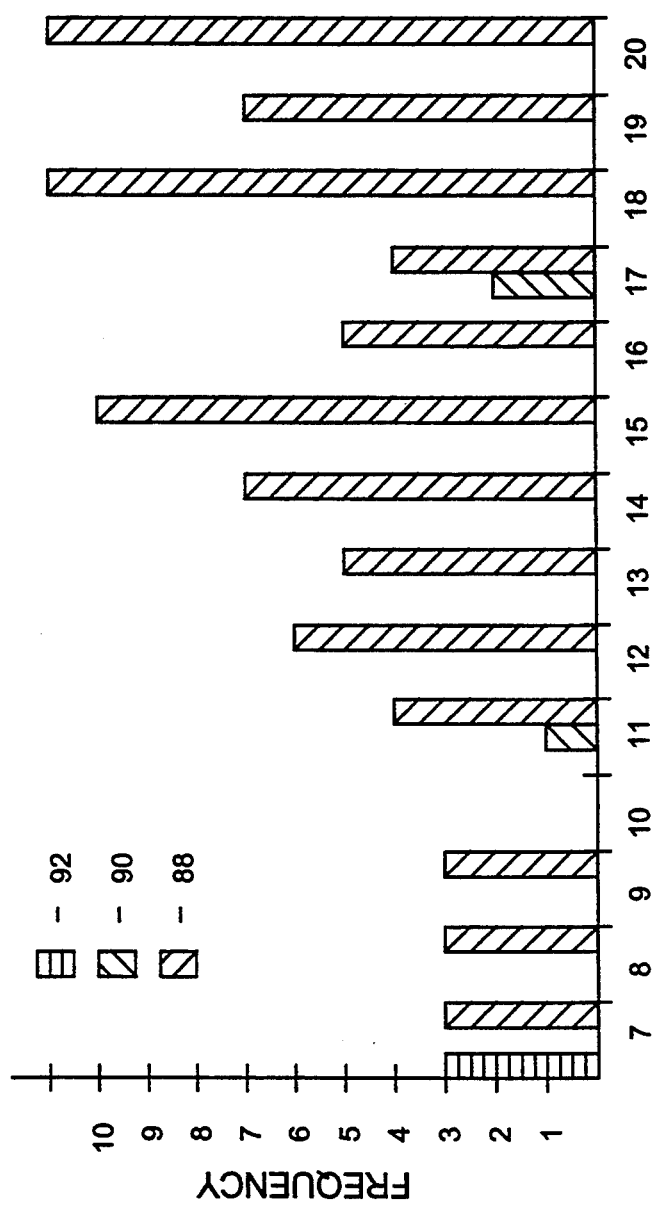
FIG. 7 is a histogram of incidences of actual gate oxide breakdown failures taken at various voltages and as a comparison between conventional processes and the process of the present invention.

A gate oxide formed according to the process steps of FIG. 3 can undergo relatively high gate oxide voltages prior to breakdown, as shown in FIG. 7. FIG. 7 illustrates a histogram of incidences of actual gate oxide breakdown failures taken at various voltages, and a comparison is taken between non-denuded and non-gettered CZ wafers 88, EPI wafers 90, and pre-process hydrogen denuded and process-induced gettered wafers 92. Testing was performed on wafers having a target gate oxide of 180 Å and a gate oxide area of 2.4 mm². Excluding three unexplained failures at 7 volts, pre-processed denudation and post polysilicon intrinsic gettering wafers 92 provide superior oxide breakdown results compared to non-denuded and non-gettered CZ wafers 88. Also, it appears that wafers 92 are somewhat superior to EPI wafers 90 in gate oxide performance. More importantly, however, wafers 92 (which are non-EPI wafers) are much cheaper to manufacture and obtain.

It will be appreciated to those skilled in the art having the benefit of this disclosure that this invention is believed to be capable of applications with any MOS device, including flash EPROM or EEPROM memory devices. Furthermore, it is also to be understood that the form of the invention shown and described is to be taken as a presently preferred embodiment. Various modifications and changes may be made to each and every processing step as would be obvious to a person skilled in the art having the benefit of this disclosure without departing from the spirit and scope of the invention as set forth in the claims. It is intended that the following claims be interpreted to embrace all such modifications and changes and, accordingly, the specification and drawings are to be regarded in an illustrative rather than a restrictive sense.

What is claimed is:

1. A method for minimizing flux of oxygen atoms and interstitial silicon atoms toward a front side surface of a silicon substrate during and after denudation and before a polysilicon layer is placed upon a gate oxide, said method comprising the steps of:

prior to processing a silicon substrate, denuding by heating to a temperature exceeding 1100° C. in the presence of a hydrogen ambient a plurality of oxygen atoms from a surface area within said silicon substrate;

prior to placing polysilicon upon said silicon substrate, processing said silicon substrate at temperatures less than 1000° C. (i) to minimize formation of and movement of oxygen atoms and interstitial silicon atoms from the silicon substrate to the surface of the substrate, and (ii) to form a patterned field oxide upon said substrate, MeV implanted well regions underlying spaces between said patterned field oxide and a gate oxide upon the well regions; and depositing polysilicon upon said gate oxide and thereafter continuing processing said silicon substrate at temperatures above 1000° C. to provide gettering sites within said substrate.

* * * * *